United States Patent [19]
Ramos Fernandez et al.

[11] Patent Number: 5,592,031
[45] Date of Patent: Jan. 7, 1997

[54] FAST BIDIRECTIONAL ANALOG SWITCHING SYSTEM FOR HF PULSES OF HIGH INSTANTANEOUS POWER

[75] Inventors: Antonio Ramos Fernandez; Pedro T. Sanz Sanchez, both of Madrid, Spain

[73] Assignee: Consejo Superior Investigaciones Cientificas, Madrid, Spain

[21] Appl. No.: 383,049

[22] Filed: Sep. 28, 1994

[63] Continuation of PCT/ES93/00102, Dec. 29, 1993.

[30] Foreign Application Priority Data

Jan. 28, 1993 [ES] Spain ................................. 9300154

[51] Int. Cl.$^6$ ................................................. H01P 1/10
[52] U.S. Cl. ........................... 307/112; 307/146; 327/300; 333/103
[58] Field of Search ..................... 327/300, 304, 327/333, 374, 377, 403, 494; 333/100, 103, 4; 375/220; 307/146, 112, 115, 116, 125

[56] References Cited

U.S. PATENT DOCUMENTS

| | | | |
|---|---|---|---|
| 4,019,069 | 4/1977 | Zambuto et al. | |
| 4,742,249 | 5/1988 | Alpaiwalla et al. | |
| 4,812,770 | 3/1989 | Dravkin | 327/300 |
| 4,903,280 | 2/1990 | Lang et al. | 375/220 |

FOREIGN PATENT DOCUMENTS

| | | |
|---|---|---|
| 2612023 | 3/1987 | France . |
| 2139835 | 11/1984 | United Kingdom . |

OTHER PUBLICATIONS

"Improved Analog Switches and Multiplexers Bring Benefits to Old and New Applications"—Peter Harold (Technology Update—May 14, 1987).

"Two–Dimensional Transmit/Receive Ceramic Piezoelectric Arrays: Construction and Performance"—James D. Plummer et al. (IEEE Transactions on Sonics and Ultrasonic, vol. SU–25 No. 5–4 Sep. 1978).

"Don't Trade Off Analog Switch Specs. VMOS—A Solution to High Speed, High Current, Low Resistance Analog Switches" (Elecrtronic Design 1977).

"Properties For 2D Multiplexed Array For Acoustic Imaging"—J. F. Gelly C. Maerfeld—Ultrasonic Symposium 1981, Siliconix Incorporated (Mospower Design Catalog, Jan. 1983).

"A Two–Dimensional Array Receiver for Reducing Refraction Artifacts in Ultrasonic Computed Tomography of Attention"—Dale W. Fitting et al. (IEEE Transactions of Ultrasonics, Frequency Control vol. UFFC—34 No. 3, May 1987).

Primary Examiner—Jonathan Wysocki
Assistant Examiner—Jonathan S. Kaplan
Attorney, Agent, or Firm—Darby & Darby, P.C.

[57] ABSTRACT

The object of the disclosed system is the fast switching of high voltage and short duration pulses on loads which requires high instantaneous intensities, in order to provide said pulses in both directions; the system is capable in switching narrow hand signals, and therefore long duration signals. The system is based on a very lower series impedance switching channel which is comprised of two high voltage capacitors ($C_1$) in series with two rectifying groups ($GR_1$ and $GR_2$) connected in opposition and whose conduction status is activated by forced injection, through said groups of a direct current controlled by a reactive network in series with a conventional low voltage unidirectional switch (CBT), thereby providing for its logical control (SL) from digital circuits TTL or CMOS. This system applies more particularly and immediately to wide band units which operates with high frequency radiations, particularly of ultrasonic type, and in fields such as diagnosis and non-invasive medical treatment and non-destructive tests of aeronautical and nuclear structures.

6 Claims, 2 Drawing Sheets

FAST BIDIRECTIONAL ANALOG SWITCHING SYSTEM FOR HF PULSES OF HIGH INSTANTANEOUS POWER

This is a continuation of international application Ser. No. PCT/ES93/00102, filed Dec. 29, 1993.

TECHNICAL FIELD

Switching of wide band pulses.
Switch using semiconductor devices (H03B 11/10).

INTRODUCTION

The purpose of this system is electronic switching of high voltage short duration monopolar pulses with very short transition times, whose spectrum consequently contains a great portion of high frequencies.

The operability of the system, depending on the actual realization and on the load impedances connected to its terminals, can reach up to 900 V and 50 MHz.

The analog switching channel permits the passing of high voltage monopolar pulses in both directions and is capable, until a certain voltage amplitude threshold, of switching long duration bipolar signals, presenting in its conducting state a notably low series impedance (in the order of 1 Ohm).

This system applies more particularly and immediately to systems for controlling wide band equipments which operate with high frequency radiations and need switching of high voltage and medium power pulses (medical echography, non-destructive evaluation of materials) or of pulses of high currents and high instantaneous powers (ultrasonic lithotripsy, echographic inspection of strongly attenuating industrial structures).

The importance of a switching system with these characteristics is based on that it offers good services simultaneously in various aspects that are normally opposed to each other in the bidirectional switching devices presently available:

Maximum peak amplitude allowed in the switched currents and voltages.

Turn-on time and available bandwidth of the switching channel.

Series impedance in the conducting state.

To this should be added the advantage that the control of the system does not require the use of high voltage sources.

STATE OF THE ART

In analog switching applications, there has until now been used methods based on the following devices; electromechanical relays, bipolar transistors, tyristors, triacs and, more recently, DMOS and VMOS transistors. Each of these devices present limitations in its functionability when fast switching of high voltage pulses of high instantaneous currents is required (for example with capacitive loads) and under wide band conditions.

The electromechanical relays offer an initially very low series resistance in the connection state, but it varies with the intensity of the current, an aspect which degrades hastily with the use of the relays. This makes these devices not very adequate for use in the aforementioned applications, which generally require the realization of several thousands of switchings per second. To this should be added the considerable activation times of these devices, which in the most rapid versions are in the order of millisecond, and also the limitations caused by the mechanical bouncing of their contacts.

The switches based on bipolar transistors should be controlled by means of the base current, which considerably perturbs the switched analog signal, and additionally they require to use of expensive power sources with voltages higher than the instantaneous peak voltage which one desires to switch.

The combinations of thyristors and triacs permit high powers to be managed, but introduce too much offset voltage and too many nonlinear effects [Siliconix, "Don't Trade Off Analog Switch Spec"-MOS POWER Design catalog -AN77-2, pp. 6–43/6–48, Santa Clara, Calif. 1983]. In addition, they present some practical inconveniences in high frequency applications: excessive temporal tolerances in the switching, long turn-off time and introduction of transients which degrade the switched signal, which very notably reduces the corresponding dynamic range.

The analog switches based on DMOS technology [J. D. Plummer et al., "Two-Dimensional Transmit/Receive Ceramic Piezoelectric Arrays: Construction and Performance", IEEE Trans. Sonic and Ultrason. Vol. SU-25, No 5, pp. 273–280, 1978] allow their integration in reduced size chips [P. Harold, "Improved analog switches and multiplexers bring benefits to old and new applications", EDN. May 14. pp. 65–74, 1987]; There exists a wide range of these devices, commercialized by different companies among which the following ones could be emphasized: Analog Devices Inc., Intersil, Maxim I. P., and Siliconix Inc. These devices generally present low distortion and a good frequency response, but in spite of the continuous innovations introduced by different manufacturers, especially by Siliconix, the maximum peak voltage that can be switched is about 60 volts, and the resistances in the conducting state are in the order of 40 or 50 ohms, which seriously limits the maximum allowable current.

Finally, the switching systems based on VMOS power transistors, proposed by some authors [Siliconix, "Don't Trade Off Analog Switch Spec" -MOS POWER Design catalog -AN77-2, pp. 6–43/6–48, Santa Clara, Calif., 1983], allow the switching of until 10 watts, linearly, with low ON impedance and very reduced distortion, thanks to the purely resistive characteristics of the drain-source channel. However, they only permit the switching of positive pulses, as they practically turn into a short circuit for negative voltages from −0.6 volts. Some solutions to this problem involve several VMOS transistors in relatively complex circuits which notably raises the costs of the switching process, especially in multichannel type applications (Acustical Imaging, Ultrasonic Tomography), [J. F. Gelly and C. Maerfeld, "Properties for a 2D Multiplexed Array for Acoustic Imaging", IEEE Ultrasonic Symp. Proc., pp. 685–689, 1981; D. W. Fitting et al., "A Two-Dimensional Array Receiver for Reducing Refraction Artifacts in Ultrasonic Computed Tomography of Attenuation", IEEE Trans. Ultrason. Ferroel. Freq. Control, Vol. UFFC-34, No 3, pp. 346–356, 1987]. Even though this type of switches can control fairly high currents (thanks to their low ON resistance), they present limitations similar to those of the switches based on DMOS transistors in what regards the maximum switchable voltage and the necessity of bias sources with voltages superior to the peak amplitudes of the pulses which are to be switched.

BRIEF DESCRIPTION OF THE INVENTION

The basic principle of the procedure object of the present invention is outlined in FIG. 1, in which two functional diagrams are shown which solely differ in the polarity of the power source which produces the voltage $V_p$, and in the orientation of the rectifier sets $GR_1$ and $GR_2$.

The main conductor channel A-B for the switching of the power pulse is formed by the connection in series of two high voltage capacitors $C_1$ and two rectifier sets $GR_1$ and $GR_2$ capable of tolerating high voltages when breaking and oriented in contrary directions in what regards the conduction of current. In the figure, two possible configurations of the system are presented, according to the polarity chosen for the source $V_p$.

The rectifier sets $GR_1$ and $GR_2$ can be formed by any parallel-series combination of semiconductor devices with rectifying characteristics; the only conditions requireable are the contrary orientations of the two rectifier sets and, in the case of high voltage input pulses, that the rectifiers present a reverse storage time superior to the width of the pulse to be switched, which is fulfilled in a great number of devices commercially available.

In the off state, i.e. when the circuit is open becauses so is the switch CBT, the channel A-B presents high impedance for any bipolar signal, $V_1$ and $V_2$, connected to any of the main terminals of the switch.

The transition to the conducting state is achieved by means of closing an unidirectional current switch of conventional type, CBT, of low voltage (in the order of 20–40 V), which, therefore, can be controlled by a logic signal SL from conventional TTL or CMOS logic circuits. The closing of the switch CBT gives rise to the passing of a continuous current through the central branch and $GR_1$ and $GR_2$ from a low voltage source $V_p$ (preferably less than 50 V) with the adequate polarity according to the connection chosen from the two possible ones for the rectifier sets. This current is established through the inductance $L_3$ (which can be omitted), the resistance $R_1$ and the two series networks formed by the rectifier ($GR_1$ or $GR_2$), the resistance ($R_2$ or $R_3$), and the inductance ($L_1$ or $L_2$), which can also be omitted, corresponding to each of the lateral branches of the circuit. Under these conditions, the main channel A-B of the circuit allows the passing of pulses with peak voltage much higher than $V_p$ (in the order of 100 to 800 V), as long as their duration does not exceed the reverse storage time of $GR_1$ and $GR_2$ and, as long as the conducting state lasts, of any associated signal of long duration and low voltage with peak-to-peak amplitudes inferior to a voltage in the order of $V_p/2$ (which depends on the values chosen for the resistances $R_1$, $R_2$ and $R_3$).

DETAILED DESCRIPTION OF THE INVENTION

Figure 1A:
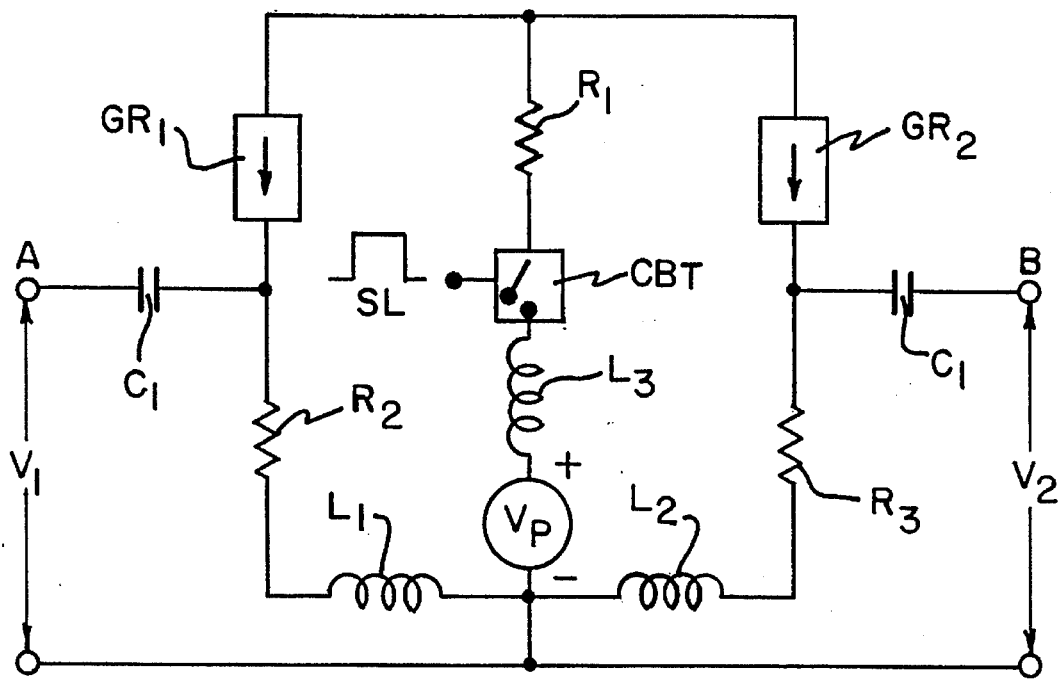
FIGS. 1a and 1b demonstrate the basic principle of the switching system according to an embodiment of the present invention.

The switching system, object of the present invention, is constituted by a main conductor channel and of two secondary polarizing low voltage circuits (for the activation of the main conductor channel) composed of three branches symmetrically connected to the intermediate nodes of the main channel, which is formed by the series connection of two high voltage capacitors connected to the two external terminals of the channel, and of two rectifier sets oriented so that their connection to the central point of the channel interconnects the terminals of each set with the same polarity. The voltage $V_p$ of the polarization source in the central branch can have a nominal value at least one order of magnitude inferior to the maximum switchable peak voltage.

The two rectifier sets, included in the switching channel, must have a reverse storage time superior to the duration of the high voltage pulses switchable through them; these groups can be formed by different combinations of circuits with suitable rectifying characteristics, based on semiconductors such as diodes, bipolar transistors, thyristors, triacs or MOS transistors, grouped in series or in parallel, so as that, by adding new components of this type in series or parallel connection, the maximum switchable voltage or current can be increased.

The three branches of the polarization circuits contain inductive reactances connected in series with resistances, in order to obtain high values of input impedance at the terminals of the switch, which makes the application of the switch possible in multichannel type configurations.

When with the high voltage pulses signal (typically in the order of 100 to 800 V) is associated (in the same pulse train or as an answer to this signal) a low voltage one, whose peak value does not exceed a threshold value, $V_L$, of an order of magnitude given by the expression $$V_u = V_p/(1+R_1/R_3+R_1/R_2)$$

the main switching channel does not present any limitation in the temporal duration allowed for the switched signal, i.e., the signal will pass as long as there exists a conducting state through the two rectifier sets, even though its duration has surpassed the reverse storage time of them.

This feature is very adecuate for transceiver systems such as pulse-echo systems, in which their limited pass band gives rise to, in the reception stage, low amplitude signals but with a duration far greater than the duration of the pulse used for their high voltage excitation. The bidirectional behaviour of the switch, object of the present invention, is thus suitable for this kind of applications.

The choice of sufficiently high values for $C_1$, for example 100 nF, guarantees a perfect isolation of the switched signals with respect to the polarization circuits, without introducing substantial distortions into these signals. The incorporation of these series capacitors in the ends of the conduction channel, with impedance in the radio frequency range several orders of magnitude inferior to the impedance of the polarization branches and of the switched load, makes possible the switching of signals with very long duration as long as the total peak-to-peak amplitude of these signals does not exceed twice the voltage threshold $V_u$ determined by the indicated formula.

Figure 2:
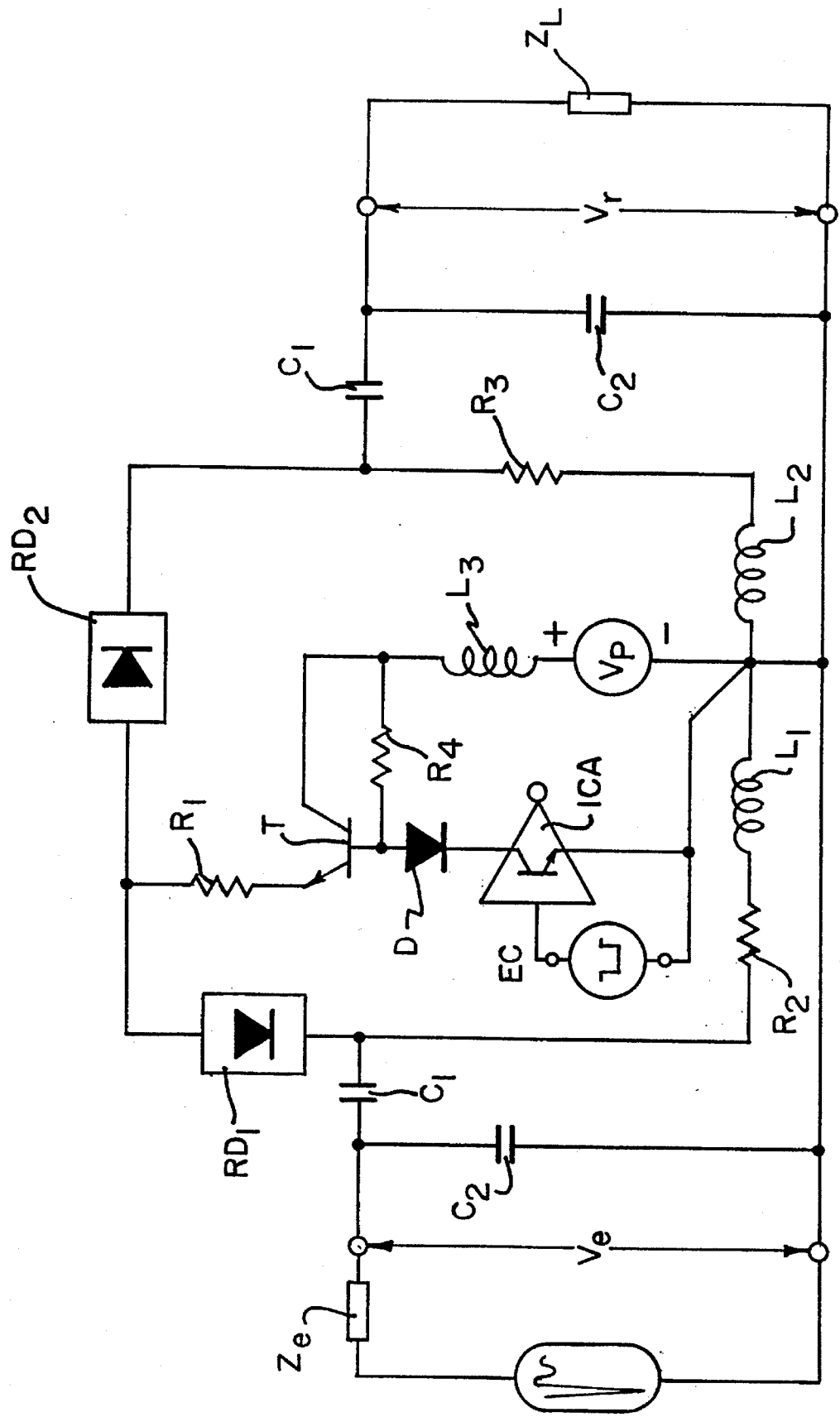
FIG. 2 schematically shows a practical representation of the switching system according to an embodiment of the present invention.

In FIG. 2 one way to materialize the present invention is shown in detail. The circuit shown in this figure permits the direct control of the switching channel by means of a control input (EC) activated by logic signals of the TTL type. In this case, the current switch CBT is materialized by means of a logic inverter circuit with open collector output (ICA), for example ⅙ of the chip 7406, connected through a diode D to the base of the NPN type transistor T which, because of its polarization from the collector through the resistance $R_4$, supplies the continuous current necessary for activating the power channel. The rectifier sets $GR_1$ and $GR_2$ are implemented by means of two diode networks $RD_1$ and $RD_2$.

The circuit includes the capacitors $C_2$ (whose capacity is at least two orders of magnitude less than the capacity of the capacitors $C_1$), in parallel with the input impedances $Z_s$ y $Z_L$. The purpose of this is to minimize the dependency of the leakage currents during the non-active phases of the main channel with these impedances.

The conductor channel $C_1$—$RD_1$—$RD_2$—$C_1$ permits, when it is active, the reception at terminals of the input capacitor $C_2$ of echo signals $V_r$ originating from active loads $Z_L$ (for example of piezoelectric type), as a response to their previous excitation by means of the transmission of a pulse $V_e$ with high instantaneous power through said channel.

The main advantages of the present invention in comparison with alternative procedures are summarized under the following points:

Its capacity for switching high voltages, in the order of several hundreds of volts, without using mechanical type contacts or high voltage bias sources.

Its low series impedance during conduction, which is not degradable during long time use, in combination with its short activation time allows switching of high currents (several) amperes in the case of a typical materialization) in a wide radio frequency range, and with high pulse repetition rates.

This circuit, fitting conveniently the values of the resistances, capacitors and inductances to the loads $Z_e$ y $Z_L$, allows the control, from a low voltage source $V_p$, of the switching of short impulses $V_e$, normally shorter than 1 microsecond, with high peak voltages and currents, which can be adjusted optimally in each application by using a sufficient number of diodes with appropriate characteristics in each RD network.

DESCRIPTION OF THE DRAWINGS

Figure 1B:
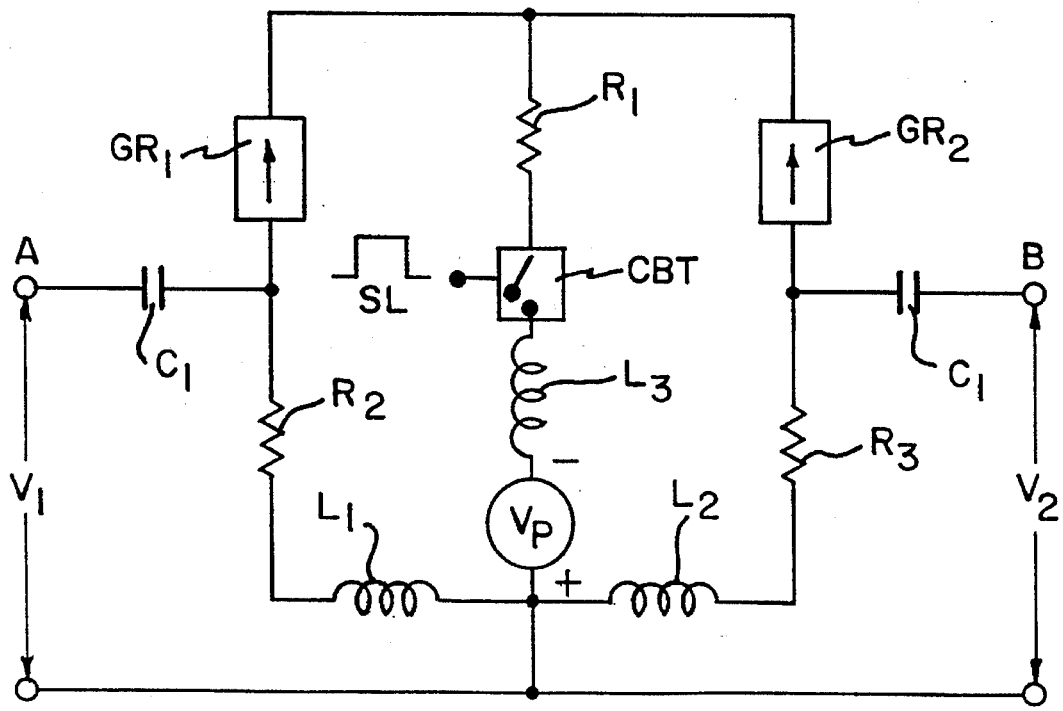

FIG 1, comprising FIG. 1A and FIG. 1B basic principle of the switching system.

A, B Access terminals to the switching channel.

$V_1$, $V_2$ Voltage between the terminals A, B and ground, respectively.

$C_1$ High voltage capacitors.

$R_1$, $R_2$, $R_3$ Electrical resistances.

$L_1$, $L_2$, $L_3$ Inductances.

$GR_1$, $GR_2$ Rectifier sets mono or multi- component, connected to the resistance $R_1$ either through their anodes or through their cathodes.

CBT Low voltage switch.

$V_p$ Low voltage source for polarization of the switching channel by means of closing the switch CBT. The polarity (+,−) of this source is determined by the direction chosen for the flow of continuous current in $GR_1$ and $GR_2$.

SL Input logic signal for the control of the switch.

FIG. 2 A practical realization of the invention, which can be controlled digitally by means of TTL pulses.

$V_a$ High voltage excitation pulse.

$V_r$ Echo voltage received as a response to $V_a$.

$Z_e$ Output impedance of the generator of the pulse $V_e$.

$Z_L$ Load impedance.

$C_1$, $C_2$ Electrical capacitors.

$R_1$, $R_2$, $R_3$, $R_4$ Electrical resistances.

$L_1$, $L_2$, $L_3$ Inductances.

$RD_1$, $RD_2$, Diode networks based on series and/or parallel connections.

T Low voltage high frequency NPN transistor.

D Rectifier diode.

$V_p$ Low voltage source.

ICA Logic inverter with open collector output.

EC Control input, adapted to TTL type logic.

What is claimed is:

1. A fast bidirectional analog switching system for high frequency pulses of high instantaneous power, comprising:

an input node, an output node and a common node;

a main channel between said input and output nodes having ON and OFF states for switching high voltage pulses in both directions, said channel including a pair of rectifiers connected so as to be conductive in opposite directions;

a common branch extending between a point in said main channel and said common node, thereby defining a first secondary circuit between said input node and said common node and a second secondary circuit between said output node and said common node, each of said secondary circuits sharing a rectifier with said main channel;

said common branch including, in series circuit, a voltage source of value $V_p$, a current switch, and impedance means for presenting a high impedance to pulses of either polarity with a peak voltage greater than $V_p$ when the main channel is OFF; and coupling means in said secondary circuits for providing efficient coupling in both the ON and OFF states of the main channel to high voltage pulse generators connected to said input node and to receivers connected to said output to said output node which exhibit impedance that is one of low and inclusive of an inductive component.

2. A switching system according to claim 1, wherein the impedance means of the common branch is formed by a resistance $R_1$, said current switch being controlled by means of a logic control signal and an inductance $L_3$ of a value adequate to provide a high impedance in the bandwidth of the high voltage pulses.

3. A switching system according to claim 1, wherein the coupling means include an input circuit formed by a capacitor $C_1$ of breakdown voltage greater than the peak amplitude of the switched pulses in series with resistive components $R_2$ or $R_3$, and inductive components, $L_1$ or $L_2$, of adequate values to provide a high impedance in the bandwidth of said high voltage pulses and optionally, in parallel with said input circuit, a capacitor $C_2$ which also is of high voltage and with a capacity at least two orders of magnitude inferior to the capacity of $C_1$.

4. A switching system according to claim 3, wherein, when the input or output nodes in addition to a high voltage pulse $V_p$, contains other signals of lower voltage, whose peak values do not exceed a threshold, $V_u$, of an order of magnitude given by the expression $$V_u = V_p/(1+R_1/R_3+R_1/R_2),$$

the system is capable of switching said signals independently of their duration, that is, the signals can continue passing in both directions, as long as the rectifiers remain in their conductive state, even if the interval of existence of these signal exceeds the reverse storage time of the rectifiers.

5. A switching system according to claim 2, wherein the control of ON-OFF switching state is performed from TTL or CMOS logic levels, using a logic inverter with open-collector output coupled by diode to the base of a bipolar transistor which works as low voltage switch in the common branch.

6. A switching system according to claim 1, wherein the control of ON-OFF switching state is performed from TTL or CMOS logic levels, using a logic inverter with open-collector output coupled by diode to the base of a bipolar transistor which works as low voltage switch in the common branch.

* * * * *